(12) United States Patent
Makiyama

(10) Patent No.: US 8,227,895 B2
(45) Date of Patent: Jul. 24, 2012

(54) CAPACITOR AND SEMICONDUCTOR DEVICE

(75) Inventor: Kozo Makiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/021,104

(22) Filed: Feb. 4, 2011

(65) Prior Publication Data

US 2011/0227193 A1 Sep. 22, 2011

(30) Foreign Application Priority Data

Mar. 19, 2010 (JP) ................................. 2010-65040

(51) Int. Cl.
*H01L 29/92* (2006.01)

(52) U.S. Cl. ...................................................... 257/532

(58) Field of Classification Search ................. 257/532, 257/296–316, 535, 595–602, 923–924, E27.016–E27.017, 257/E27.019–E27.021, E27.023–E27.025, 257/E27.03–E27.035, E27.037–27.038, E27.041–E27.045 257/E27.047–E27.048, E27.071, E27.09, 257/E27.092–E27.093, E29.095, E27.101, 257/E27.114–E27.116, E21.008–E21.021, 257/E21.364, 508, 639, 411, 637, 640, 649, 257/68–71, 905–908, E27.084–E27.097, 257/E27.075, E21.646–E21.66; 438/171, 438/190, 210, 238–253
See application file for complete search history.

(56) References Cited

U.S. PATENT DOCUMENTS

| | | | |
|---|---|---|---|
| 6,153,898 A | | 11/2000 | Watanabe et al. |
| 6,774,462 B2* | | 8/2004 | Tanaka et al. ................ 257/639 |
| 7,372,113 B2* | | 5/2008 | Tanaka et al. ................ 257/411 |
| 7,879,738 B2* | | 2/2011 | Wang ............................ 438/778 |
| 2006/0244046 A1* | | 11/2006 | Mori ............................. 257/315 |
| 2007/0212843 A1 | | 9/2007 | Horiuchi |
| 2008/0017914 A1* | | 1/2008 | Natori et al. ................. 257/315 |
| 2008/0017954 A1 | | 1/2008 | Suzuki et al. |
| 2008/0296653 A1* | | 12/2008 | Ozawa et al. ................ 257/316 |
| 2009/0021888 A1* | | 1/2009 | Jung ............................. 361/303 |

FOREIGN PATENT DOCUMENTS

| | | |
|---|---|---|
| JP | 11-26706 A | 1/1999 |
| JP | 2004-221446 A | 8/2004 |
| JP | 2007-35830 A | 2/2007 |
| JP | 2007-234726 A | 9/2007 |
| JP | 2008-28249 A | 2/2008 |

* cited by examiner

*Primary Examiner* — Dao H Nguyen
*Assistant Examiner* — Tram H Nguyen
(74) *Attorney, Agent, or Firm* — Fujitsu Patent Center

(57) ABSTRACT

A capacitor includes a lower electrode formed over a semiconductor substrate; a first insulating film formed over the lower electrode; a second insulating film formed over the first insulating film; a third insulating film formed over the second insulating film; and an upper electrode formed over the third insulating film, the density of the first insulating film being greater than that of the second insulating film, and the density of the third insulating film being greater than that of the second insulating film.

20 Claims, 16 Drawing Sheets

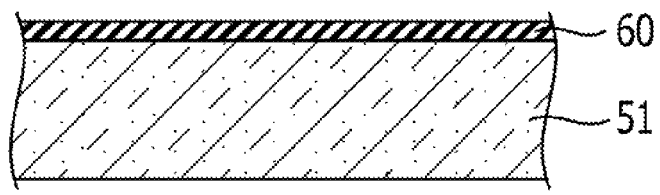
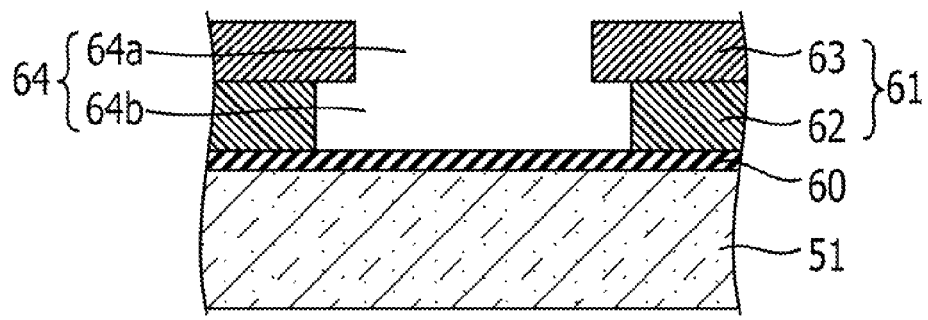
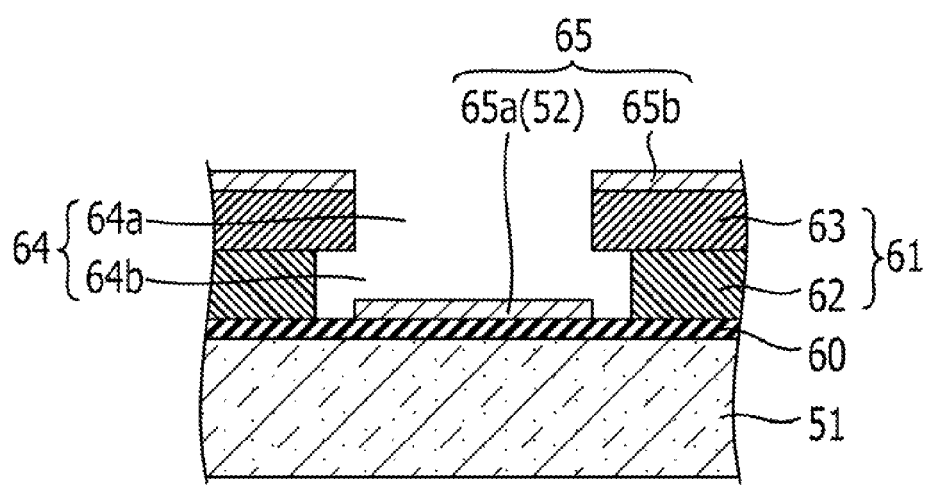

CAPACITOR AND SEMICONDUCTOR DEVICE

CROSS-REFERENCE TO RELATED APPLICATIONS

This application is based upon and claims the benefit of priority of the prior Japanese Patent Application No. 2010-065040, filed on Mar. 19, 2010, the entire contents of which are incorporated herein by reference.

FIELD

The present invention relates to capacitors and semiconductor devices.

BACKGROUND

Radio-frequency semiconductor integrated circuits (ICs) have kinds of passive elements, for example, metal insulation metal (MIM) capacitors. An example of radio-frequency semiconductor ICs is compound semiconductors. Transistors contained in recent semiconductor ICs need high voltage to drive, and thus there has been a demand for high-voltage-resistant MIM capacitors. In particular, semiconductor ICs based on nitrides such as gallium nitride (GaN) contain transistors with a high driving voltage requirement, and thus MIM capacitors used in them should be highly resistant to high voltage.

When used for monolithic microwave integrated circuits (MMICs) based on compound semiconductors, MIM capacitors should be resistant to dielectric breakdown even at voltage levels higher than the driving voltage of transistors, for reliability and other performance.

Publications disclosing related arts include the following: Japanese Unexamined Patent Application Publication No. 2007-35830, Japanese Unexamined Patent Application Publication No. 11-26706, Japanese Unexamined Patent Application Publication No. 2004-221446, Japanese Unexamined Patent Application Publication No. 2007-234726, and Japanese Unexamined Patent Application Publication No. 2008-28249.

SUMMARY

According to an aspect of the invention, a capacitor includes: a lower electrode formed over a semiconductor substrate; a first insulating film formed over the lower electrode; a second insulating film formed over the first insulating film; a third insulating film formed over the second insulating film; and an upper electrode formed over the third insulating film, the density of the first insulating film being greater than that of the second insulating film, and the density of the third insulating film being greater than that of the second insulating film.

According to another aspect of the invention, a capacitor includes: a lower electrode formed over a semiconductor substrate; a first insulating film formed over the lower electrode; a second insulating film formed over the first insulating film; a third insulating film formed over the second insulating film; and an upper electrode formed over the third insulating film, the degree of hydrogen termination in the first insulating film being less than that in the second insulating film, and the degree of hydrogen termination in the third insulating film being less than that in the second insulating film.

According to another aspect of the invention, a semiconductor device includes: a lower electrode formed over a semiconductor substrate; a first insulating film formed over the lower electrode; a second insulating film formed over the first insulating film; a third insulating film formed over the second insulating film; and an upper electrode formed over the third insulating film, the density of the first insulating film being greater than that of the second insulating film, and the density of the third insulating film being greater than that of the second insulating film.

According to another aspect of the invention, a semiconductor device includes: a lower electrode formed over a semiconductor substrate; a first insulating film formed over the lower electrode; a second insulating film formed over the first insulating film; a third insulating film formed over the second insulating film; and an upper electrode formed over the third insulating film, the degree of hydrogen termination in the first insulating film being less than that in the second insulating film, and the degree of hydrogen termination in the third insulating film being less than that in the second insulating film.

The object and advantages of the invention will be realized and attained by the elements, features, and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 10A to 10J illustrate manufacturing method of the MIM capacitor according to the second embodiment.

DESCRIPTION OF EMBODIMENTS

Figure 1:
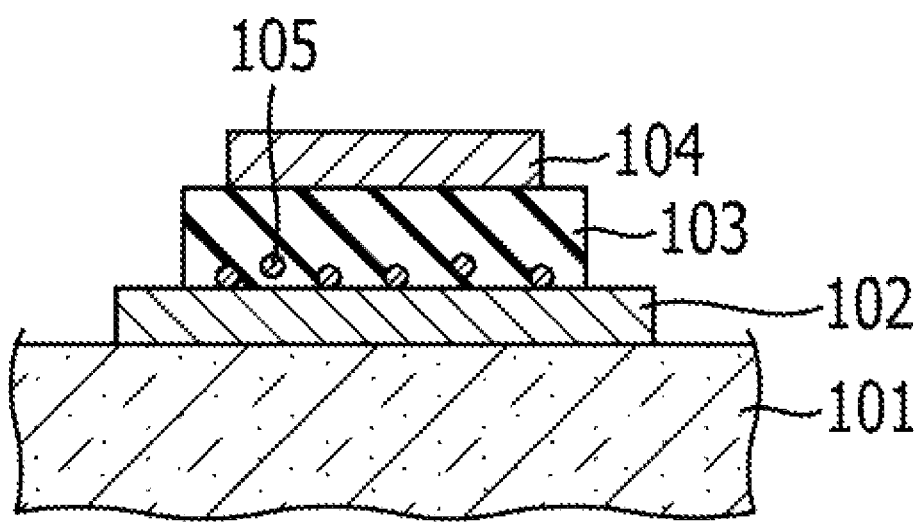
FIG. 1 illustrates an MIM capacitor.

An MIM capacitor includes, as illustrated in FIG. 1, a semiconductor substrate 101, a lower electrode 102, an insulating film 103, and an upper electrode 104. The semiconductor substrate 101 is made of any kind of compound, the insulating film 103 is made of silicon nitride (SiN) or some other kind of insulating compound, and the lower electrode 102 and the upper electrode 104 are made of gold (Au), aluminum (Al), or some other kind of metal. SiN, the material of the insulating film 103, is deposited by plasma chemical vapor deposition (CVD) to form a film. However, forming a highly insulating SiN film by plasma CVD involves plasma-induced generation of ions, and these ions unfortunately bombard the basal layer, the lower electrode 102. This ion bombardment splashes some portion of the metallic materials of the lower electrode 102, and the splashed portion enters the insulating film 103 as metallic contaminants 105 and thereby reduces the dielectric breakdown resistance of the insulating film 103; the resultant semiconductor IC may be lacking in reliability.

Figure 2:
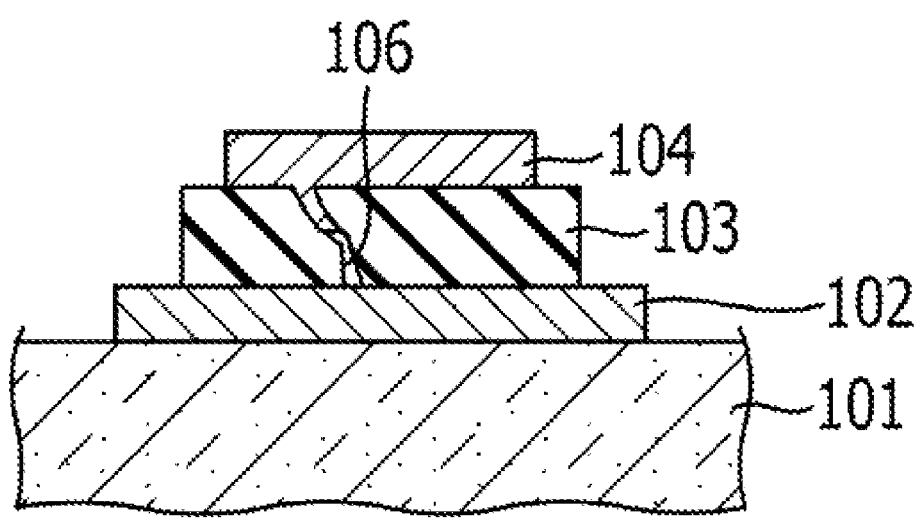
FIG. 2 illustrates an MIM capacitor.

Furthermore, forming the insulating film 103 from SiN causes pinholes 106 to occur as illustrated in FIG. 2. The pinholes 106 may lead to a shorter effective interelectrode distance between the lower electrode 102 and the upper electrode 104. More specifically, the pinholes 106 may retain some portion of the metallic materials of the upper electrode 104 and other relevant members flowing thereinto, and a shortened effective interelectrode distance results therefrom despite the presence of the insulating film 103. This also reduces the dielectric breakdown resistance of the insulating film 103; the resultant semiconductor IC may be lacking in reliability.

MIM capacitors may experience dielectric breakdown at a voltage level of about 70 V even when the insulating film 103 has a thickness large enough, for example, a thickness in the range of 200 nm to 300 nm.

The following describes the first embodiment. An example application of this embodiment is an MIM capacitor for a powerful radio-frequency semiconductor device.

The inventors made studies on MIM capacitors to determine the mechanism of the contamination of the insulating film 103 illustrated in FIG. 1, more specifically, why the insulating film 103 is contaminated with metallic contaminants 105 derived from the material of the lower electrode 102, and finally identified the mechanism. In the manufacturing of an MIM capacitor like the one illustrated in FIG. 1, the conditions of film formation are adjusted for possible maximum dielectric breakdown resistance of the insulating film 103 so that the resultant MIM capacitor can be resistant to dielectric breakdown. As described above, the insulating film 103 is formed from SiN or some other kind of insulating material, and the film formation method used here is usually plasma CVD or the like. In film formation methods like plasma CVD, forming the insulating film 103 under conditions adjusted for high dielectric breakdown resistance indicates providing the precursor of the insulating film with a high level of kinetic energy. The reason for this is because the conditions of film formation giving a high level of kinetic energy to the insulating-film precursor allow for the complete dissociation of the gas introduced and thus the resultant insulating film 103 is pure, dense, and highly resistant to dielectric breakdown.

However, such conditions of film formation also lead to an enhanced level of the bombardment (with ions of the elements constituting the insulating film 103) of the basal layer, the lower electrode 102. This high level of ion bombardment splashes some portion of the metallic materials of the lower electrode 102, and the splashed portion diffuses and spreads inside the insulating film 103 as metallic contaminants 105. With metal contaminants 105 included therein, therefore, the insulating film 103 has a reduced level of dielectric breakdown resistance despite the conditions of film formation adjusted for high dielectric breakdown resistance.

On the other hand, the reverse conditions of the formation of the insulating film 103, under which the precursor of the insulating film is given a lower level of kinetic energy, lead to a lower level of the ion bombardment of the lower electrode 102. Thus, such conditions scarcely allow the contamination of the insulating film 103 with metallic contaminants 105 derived from the material of the lower electrode 102. However, such conditions also lead to an incomplete dissociation of the gas introduced, and thus the resultant insulating film 103 is impure, sparse, and poorly resistant to dielectric breakdown.

The inventors also made other studies on MIM capacitors, looking for the mechanism of the pinhole formation illustrated in FIG. 2, more specifically, why pinholes 106 are formed in the insulating film 103, and finally identified the mechanism. Usually, the formation of the insulating film 103 is performed under a single set of conditions, or in a single mode, from start to finish. In any single mode of film formation, the insulating film 103 is put under the influence by its basal layer while it is growing. Thus, any defects on the basal layer or other pinhole signs present at the start of film formation may affect the film formation process and appear in the resultant insulating film 103 as pinholes 106.

For the formation of the insulating film by plasma CVD, the following describes the relationship between the kinetic energy of the insulating-film precursor and the characteristics of the resultant film. More specifically, FIG. 3 illustrates a relationship between the kinetic energy of the insulating-film precursor and the adhesive force between the precursor and the electrode facing it, and FIG. 4 illustrates a relationship between the kinetic energy of the insulating-film precursor and the dielectric breakdown resistance of the precursor.

Figure 3:
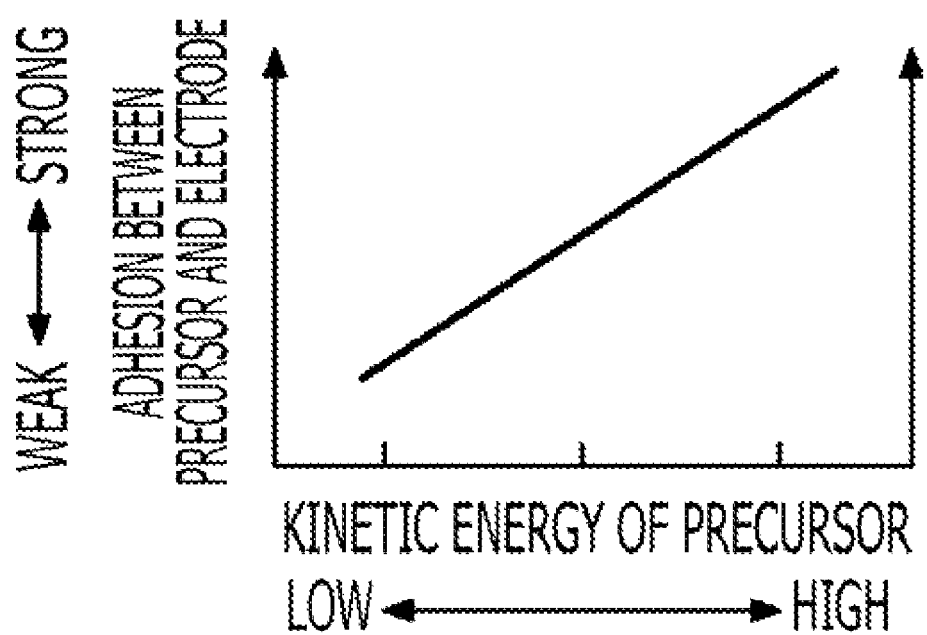
FIG. 3 illustrates a relationship between the kinetic energy of an insulating-film precursor and the adhesive force between the precursor and the electrode facing it.

As can be seen from FIG. 3, the higher the kinetic energy of the insulating-film precursor during film formation is, the stronger the adhesion between the precursor and the electrode facing it is, and vice versa. When plasma CVD is used, the kinetic energy of the insulating-film precursor is increased as the frequency of the alternating electric field applied for the formation of plasma is decreased, and vice versa. As described above, the conditions of the formation of the insulating film adjusted for a high level of the kinetic energy of the insulating-film precursor allow for the ion bombardment of the basal layer, the lower electrode. This high level of ion bombardment splashes some portion of the metallic materials of the lower electrode, and the splashed portion diffuses and spreads inside the insulating film as metallic contaminants; as a result, the lower electrode and the insulating film come into strong adhesion. On the other hand, the reverse conditions of the formation of the insulating film, under which the precursor of the insulating film is given a lower level of kinetic energy, lead to a lower level of the ion bombardment of the lower electrode. This low level of ion bombardment splashes only a slight portion of the lower electrode, and thus the amount of the metallic contaminants transferred from the lower electrode to the insulating film is accordingly small; as a result, the adhesion between the lower electrode and the insulating film is weak. In this embodiment, two kinds of alternating electric fields with different frequencies are used to form the insulating film: One is the low-frequency conditions, under which the alternating electric field with the lower frequency is applied, and the other is the high-frequency conditions, under which the alternating electric field with the higher frequency is applied. This also applies in the case where three or more kinds of alternating electric fields with different frequencies are used, as long as the frequencies can be categorized into two groups, the high-frequency group and the low-frequency group. Likewise, two sets of conditions of film formation are used in this embodiment: One is the low-precursor-energy conditions, under which the insulating-film precursor is given a lower level of kinetic energy, and the other is the high-precursor-energy conditions, under which the insulating-film precursor is given a higher level of kinetic energy.

Figure 4:
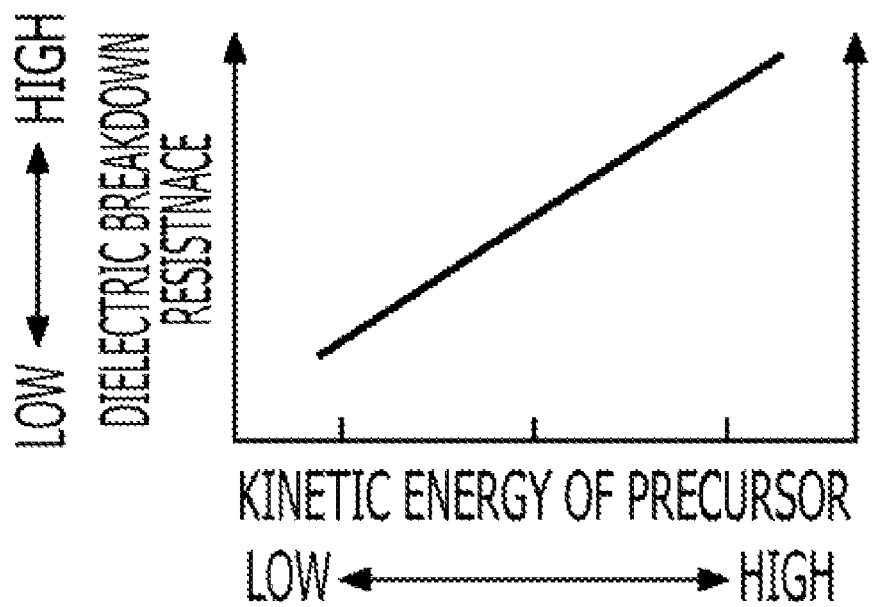
FIG. 4 illustrates a relationship between the kinetic energy of an insulating-film precursor and the dielectric breakdown resistance of the precursor.

As can be seen from FIG. 4, the higher the kinetic energy of the insulating-film precursor during film formation is, the higher the level of the dielectric breakdown resistance of the insulating film is, and vice versa. Note that FIG. 4 is based on the assumption that the dielectric breakdown resistance of the insulating film is unsusceptible to the influence by the basal layer. The tendency revealed in FIG. 4, specifically, the positive linear functional relationship between the kinetic energy of the insulating-film precursor and the dielectric breakdown resistance of the insulating film, is probably due to the fact that a higher level of the kinetic energy of the insulating-film precursor leads to a purer and denser resultant insulating film and a lower degree of hydrogen termination in the insulating film, and vise versa.

Figure 5:
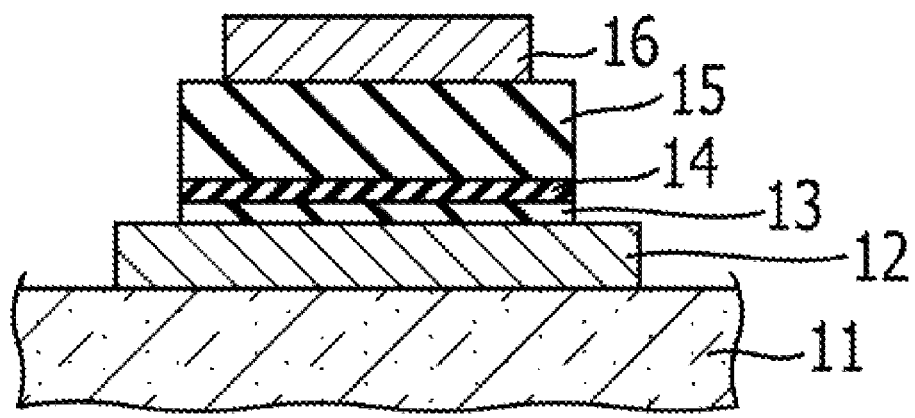
FIG. 5 illustrates the structure of an MIM capacitor according to the first embodiment.
Figure 6:
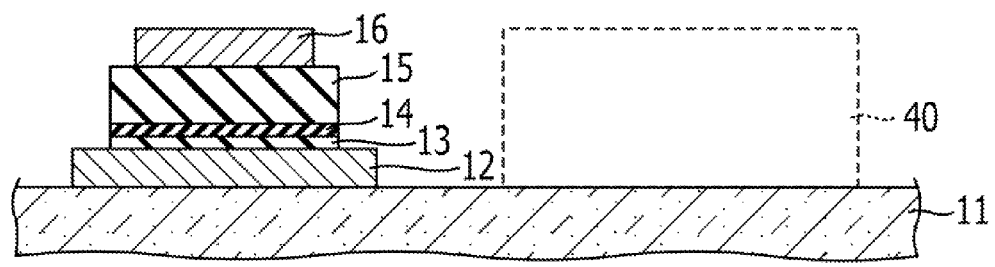
FIG. 6 illustrates the structure of a semiconductor device according to the first embodiment.

The following describes an MIM capacitor according to this embodiment with reference to FIG. 5. This MIM capacitor is formed over a semiconductor substrate 11 that is based on GaN or some other kind of nitride. Although not illustrated in the drawing, a basal SiN layer also exists between the MIM capacitor and the semiconductor substrate 11.

Although not illustrated in the drawing, the basal film has a resist pattern or the like formed thereover for the formation a lower electrode 12. This resist pattern is so formed as to have an opening corresponding in position to the area for the lower electrode 12 by the following processes: photoresist application, prebaking, light exposure, and development. The basal film is then coated by vacuum deposition with metal films including a titanium (Ti) film and a Au film, and then the metal films on the resist pattern and the resist pattern are removed together by lifting them off the basal film. In this way, the lower electrode 12 is completed as a laminate including Ti and Au.

The lower electrode 12 carries a first insulating film 13 formed thereover. With the intention of strongly adhering to the lower electrode 12, the first insulating film 13 is formed by plasma CVD under the high-precursor-energy conditions, for example, by the application of a low-frequency electric field. Incidentally, the material of the first insulating film 13 is, for example, SiN or some other kind of nitride-based insulating material. As described above, this first insulating film 13 should strongly adhere to the lower electrode 12, and thus its thickness can be as small as possible unless its adhesion to the lower electrode 12 is lost; the thickness of the first insulating film 13 is in the range of 10 nm to 20 nm, for example. The first insulating film 13 prepared in this way, or under the high-precursor-energy conditions, includes some portion of the metallic materials of (or the metal elements existing in) the lower electrode 12 diffusing and spreading therein, namely, metallic contaminants.

The first insulating film 13 carries a second insulating film 14 formed thereover. With the intention of blocking the diffusion and spread of the metallic materials of the lower electrode 12 thereinto, the second insulating film 14 is formed by plasma CVD under the low-precursor-energy conditions, for example, by the application of a high-frequency electric field. The second insulating film 14 formed in this way, or with the ion bombardment thereof reduced, is usually free from the metallic materials of the lower electrode 12. Incidentally, the material of the second insulating film 14 is, for example, SiN or some other kind of nitride-based insulating material. This second insulating film 14 should block the diffusion and spread of the metallic materials of the lower electrode 12 thereinto as described above, and insulating films formed under the low-precursor-energy conditions are usually non-resistant to dielectric breakdown. Thus, the smaller the thickness of the second insulating film 14, the better; the thickness of the second insulating film 14 is in the range of 10 nm to 20 nm, for example. Incidentally, the first insulating film 13 and the second insulating film 14 may be made of the same material (SiN or some other kind of nitride-based insulating material). In general, two layers made of a single kind of material adhere to each other well; the adhesive force between the first insulating film 13 and the second insulating film 14 possibly does not matter. In summary, the first insulating film 13 includes some portion of the metallic materials of the lower electrode 12 diffusing and spreading therein, namely, metallic contaminants, whereas the second insulating film 14 is free from the metallic materials of the lower electrode 12.

The second insulating film 14 carries a third insulating film 15 formed thereover. With the intention of providing more effective insulation, the third insulating film 15 is formed by plasma CVD under the high-precursor-energy conditions, for example, by the application of a low-frequency electric field. Formed in this way, the third insulating film 15 is highly resistant to dielectric breakdown, as can be seen from FIG. 4. Incidentally, the material of the third insulating film 15 is, for example, SiN or some other kind of nitride-based insulating material. As described above, the second insulating film 14 is free from the metallic materials of the lower electrode 12. Thus, the third insulating film 15 is also free from the metallic materials of the lower electrode 12 despite that it is formed under the high-precursor-energy conditions, or despite the intensive ion bombardment thereof. Incidentally, the second insulating film 14 and the third insulating film 15 may be made of the same material (SiN or some other kind of nitride-based insulating material). As described above, two layers made of a single kind of material usually well adhere to each other, and thus the adhesive force between the second insulating film 14 and the third insulating film 15 possibly does not matter. As for thickness, the third insulating film 15 has a thickness large enough for a desired level of dielectric breakdown resistance.

The third insulating film 15 carries an upper electrode 16 formed thereover. This upper electrode 16 is formed in the same way as the lower electrode 12. The MIM capacitor completed in this way includes three insulating layers: the first insulating film 13, the second insulating film 14, and the third insulating film 15.

Completed in this way, the MIM capacitor according to this embodiment features strong adhesion and high dielectric breakdown resistance as a whole. More specifically, the first insulating film 13, which lies on the lower electrode 12, is formed under the high-precursor-energy conditions, and thus the lower electrode 12 and the first insulating film 13 strongly adhere to each other. The first insulating film 13, the second insulating film 14, and the third insulating film 15 are made of a single kind of material, and thus the first insulating film 13 and the second insulating film 14 strongly adhere to each other, and the second insulating film 14 and the third insulating film 15 also strongly adhere to each other. Therefore, the lower electrode 12, the first insulating film 13, the second insulating film 14, and the third insulating film 15 are united by strong adhesion as a whole.

Also, the second insulating film 14, which is formed under the low-precursor-energy conditions, is usually free from the metallic materials of the lower electrode 12. Thus, the third insulating film 15, which lies on the second insulating film 14, is also free from the metallic materials of the lower electrode 12 despite that it is formed under the high-precursor-energy conditions. Furthermore, the third insulating film 15, which is formed under the high-precursor-energy conditions, is strongly resistant to dielectric breakdown. When the third insulating film 15 is thicker than the first insulating film 13 and the second insulating film 14, the insulating layers including of the first insulating film 13, the second insulating film 14, and the third insulating film 15 are highly resistant to dielectric breakdown as a whole. In this way, the MIM capacitor according to this embodiment obtains a high level of dielectric breakdown resistance.

The MIM capacitor according to this embodiment can be applied to various kinds of semiconductor devices. Semiconductor devices to which this MIM capacitor is applied carry compound semiconductors, in particular, semiconductors based on GaN or some other kind of nitride, because such semiconductors need high voltage to drive. Note that this embodiment also includes semiconductor devices that carry the MIM capacitor according to this embodiment. Although not illustrated in any drawing, a semiconductor element can be formed over the semiconductor substrate 11 to provide a semiconductor device according to this embodiment. For example, a single semiconductor substrate 11 may carry a semiconductor element 40, which is made of any compound for compound semiconductors, in addition to the MIM capacitor. This semiconductor element 40 may be connected to the lower electrode 12 and the upper electrode 16.

In this embodiment, plasma CVD is used to form the first insulating film 13, the second insulating film 14, and the third insulating film 15; however, any other technique such as sputtering may be used instead as long as plasma-induced film formation is possible or raw material elements can be given kinetic energy with or without the use of plasma. Also, the MIM capacitor according to this embodiment can be applied not only to semiconductor devices carrying semiconductors based on GaN or some other kind of nitride but also to ones carrying semiconductors based on any other semiconductor material that needs high voltage to drive. Semiconductor devices to which this MIM capacitor is applied may be ones carrying compound semiconductors that need high voltage to drive, may be ones carrying nitride-based semiconductors that need high voltage to drive, and may be ones carrying GaN-based semiconductors. As described above, the first insulating film 13, the second insulating film 14, and the third insulating film 15 are all made of a single kind of material, such as SiN, for example; however, some other kinds of insulating materials may be used instead. Examples of insulating materials that can be used here include aluminum oxide ($Al_2O_3$), hafnium oxide ($HfO_2$), and other similar compounds.

The following describes the second embodiment, which relates to an MIM capacitor that has a different constitution from the first embodiment.

The MIM capacitor according to this embodiment includes a laminate obtained by layering two kinds of insulating films: Both are formed by plasma CVD, but one is formed under the high-precursor-energy conditions, whereas the other is formed under the low-precursor-energy conditions. As described above, pinholes may occur in an insulating film when the insulating film is formed in any single mode of film formation. Thus, changing the mode of film formation with a predetermined interval based on the thickness of the film may prevent pinholes from occurring; even if any film has signs of pinholes occurring therein, the next film, which is formed in a different mode of film formation, conceals the pinhole signs. Note that the first embodiment also involves the use of different modes of film formation and thus the resultant insulating films can be free from pinholes in their early phase of formation. This embodiment may further ensure that the insulating films are free from pinholes.

Figure 7:
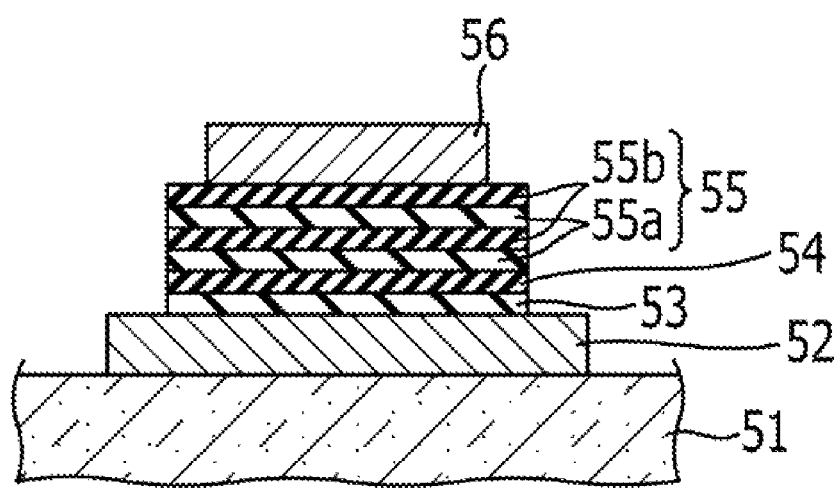
FIG. 7 illustrates the structure of an MIM capacitor according to the second embodiment.

The following describes an MIM capacitor according to this embodiment with reference to FIG. 7. This MIM capacitor is formed over a semiconductor substrate 51 that is based on GaN or some other kind of nitride. Although not illustrated in the drawing, a basal SiN layer also exists between the MIM capacitor and the semiconductor substrate 51.

Although not illustrated in the drawing, the basal film has a resist pattern or the like formed thereover for the formation a lower electrode 52. This resist pattern is so formed as to have an opening corresponding in position to the area for the lower electrode 52 by the following processes: photoresist application, prebaking, light exposure, and development. The basal film is then coated by vacuum deposition with metal films including a Ti film and a Au film, and then the metal films on the resist pattern and the resist pattern are removed together by lifting them off the basal film. In this way, the lower electrode 52 is completed as a laminate including Ti and Au.

The lower electrode 52 carries a first insulating film 53 formed thereover. With the intention of strongly adhering to the lower electrode 52, the first insulating film 53 is formed by plasma CVD under the high-precursor-energy conditions, for example, by the application of a low-frequency electric field. Incidentally, the material of the first insulating film 53 is, for example, SiN or some other kind of nitride-based insulating material. As described above, this first insulating film 53 should strongly adhere to the lower electrode 52, and thus its thickness can be as small as possible unless its adhesion to the lower electrode 52 is lost; the thickness of the first insulating film 53 is in the range of 10 nm to 20 nm, for example. The first insulating film 53 prepared in this way, or under the high-precursor-energy conditions, includes some portion of the metallic materials of (or the metal elements existing in) the lower electrode 52 diffusing and spreading therein, namely, metallic contaminants.

The first insulating film 53 carries a second insulating film 54 formed thereover. With the intention of blocking the diffusion and spread of the metallic materials of the lower electrode 52 thereinto, the second insulating film 54 is formed by plasma CVD under the low-precursor-energy conditions, for example, by the application of a high-frequency electric field. The second insulating film 54 formed in this way, or with the ion bombardment thereof reduced, is usually free from the metallic materials of the lower electrode 52. Incidentally, the material of the first insulating film 54 is, for example, SiN or some other kind of nitride-based insulating material. As described above, this first insulating film 54 should block the diffusion and spread of the metallic materials of the lower electrode 52 thereinto. And, insulating films formed under the low-precursor-energy conditions are usually nonresistant to dielectric breakdown. Thus, the smaller the thickness of the second insulating film 54, the better; the thickness of the second insulating film 54 is in the range of 10 nm to 20 nm, for example. Incidentally, the first insulating film 53 and the second insulating film 54 may be made of the same material (SiN or some other kind of nitride-based insulating material). As described above, two layers made of a single kind of material usually well adhere to each other, and thus the adhesive force between the first insulating film 53 and the second insulating film 54 possibly does not matter. In summary, the first insulating film 53 contains some portion of the metallic materials of the lower electrode 52 diffusing and spreading therein, namely, metallic contaminants, whereas the second insulating film 54 is free from the metallic materials of the lower electrode 52.

The second insulating film 54 carries a third insulating film 55 formed thereover. This third insulating film 55 is intended to provide more effective insulation, more specifically, to conceal any signs of pinholes so that the resultant MIM capacitor can be more effectively insulated and have improved reliability. Thus, the third insulating film 55 is formed by, for example, layering two kinds of insulating layers: Both are formed by plasma CVD, but one is formed under the high-precursor-energy conditions (a first insulating layer 55a), and the other is formed under the low-precursor-energy conditions (a second insulating layer 55b). In other words, the formation of the third insulating film 55 involves two alternating plasma CVD processes: one in which the first insulating layer 55a is formed by the application of a low-frequency electric field, and the other in which the second insulating layer 55b is formed by the application of a high-frequency electric field.

In film formation by plasma CVD, high-frequency electric fields and low-frequency ones provide different modes of film formation, more specifically, different kinds of plasma. When a high-frequency electric field is used, free-radical-based plasma is generated. However, when a low-frequency electric field is used, ionic plasma is generated. This is the reason why the use of different modes of film formation may prevent pinholes from occurring even if any film has signs of pinholes occurring therein.

The third insulating film 55 carries an upper electrode 56 formed thereover. This upper electrode 56 is formed in substantially the same way as the lower electrode 52. The MIM capacitor completed in this way includes three insulating layers: the first insulating film 53, the second insulating film 54, and the third insulating film 55.

The MIM capacitor according to this embodiment can be applied to various kinds of semiconductor devices. Semiconductor devices to which this MIM capacitor is applied carry compound semiconductors, in particular, semiconductors based on GaN or some other kind of nitride, because such semiconductors need high voltage to drive. Note that this embodiment also includes semiconductor devices that carry the MIM capacitor according to this embodiment. Although not illustrated in any drawing, a semiconductor element can be formed over the semiconductor substrate 51 to provide a semiconductor device according to this embodiment.

Based on the above-described constitution for the prevention of pinholes, the MIM capacitor according to this embodiment may be free from pinholes and thus highly reliable. Therefore, semiconductor devices according to this embodiment may be manufactured with fewer defects.

In this embodiment, plasma CVD is used to form the first insulating film 53, the second insulating film 54, and the third insulating film 55; however, any other technique such as sputtering may be used instead as long as plasma-induced film formation is possible or raw material elements can be given kinetic energy with or without the use of plasma. All other aspects of this embodiment are substantially the same as in the first embodiment.

The following describes a method for manufacturing an MIM capacitor according to the first embodiment with reference to FIGS. 8A to 8J.

Figure 8A:
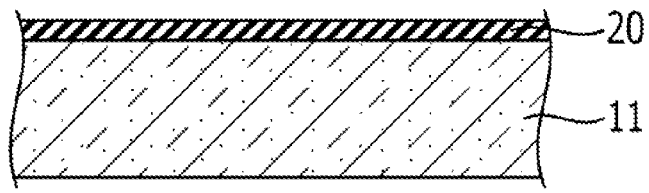
FIGS. 8A to 8J illustrate manufacturing method of the MIM capacitor according to the first embodiment.

First, a basal SiN film 20 is formed over a semiconductor substrate 11 as illustrated in FIG. 8A, by plasma CVD or some other technique. The semiconductor substrate 11 is made of GaN or some other kind of compound.

Figure 8B:
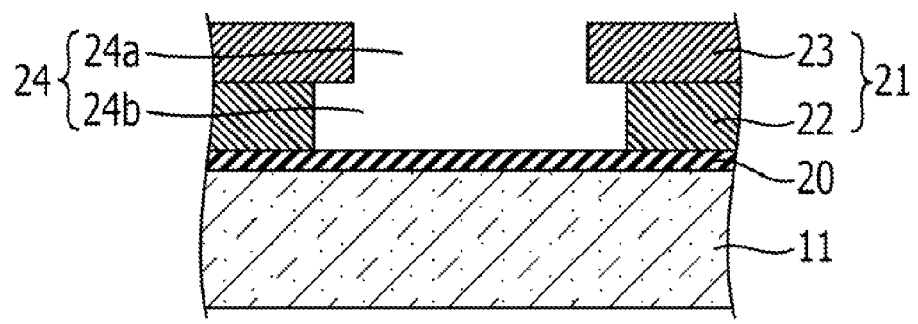

Then, a bi-layer pattern 21, the pattern used to form the lower electrode 12 mentioned later, is formed as illustrated in FIG. 8B. An example constitution of this bi-layer pattern 21 is a combination of an alkali-soluble resin layer 22 and a photoresist 23. An example formation method of the alkali-soluble resin layer 22 is as follows: The SiN film 20 is covered by spin coating with PMGI, an alkali-soluble resin manufactured by MicroChem Corporation, until the thickness of the coating is about 500 nm, and then the coating is heated at about 180° C. Also, an example formation method of the photoresist 23 is as follows: The alkali-soluble resin layer 22 is coated by spin coating with PFI-32A, an ultraviolet-curing resist manufactured by Sumitomo Chemical Co., Ltd. (a company based in Japan), until the thickness of the coating is about 1000 nm, and then the coating is heated at about 110° C. Subsequently, the bi-layer pattern 21 is irradiated with ultraviolet light and then developed; as a result, openings 24a and 24b, which are collectively referred to as a cavity 24, are formed. An example of developers that can be used here is MND-W, a product from Tokyo Ohka Kogyo Co., Ltd., with which selected areas of the photoresist 23 and the whole alkali-soluble resin layer 22 can be dissolved. In the development process, the developer dissolves selected areas of the photoresist 23, leaving the opening 24a, and then flows through this opening 24a onto the alkali-soluble resin layer 22 and dissolves it slowly and isotropically, leaving the opening 24b. Thus, the opening 24b is greater than the opening 24a.

Figure 8C:
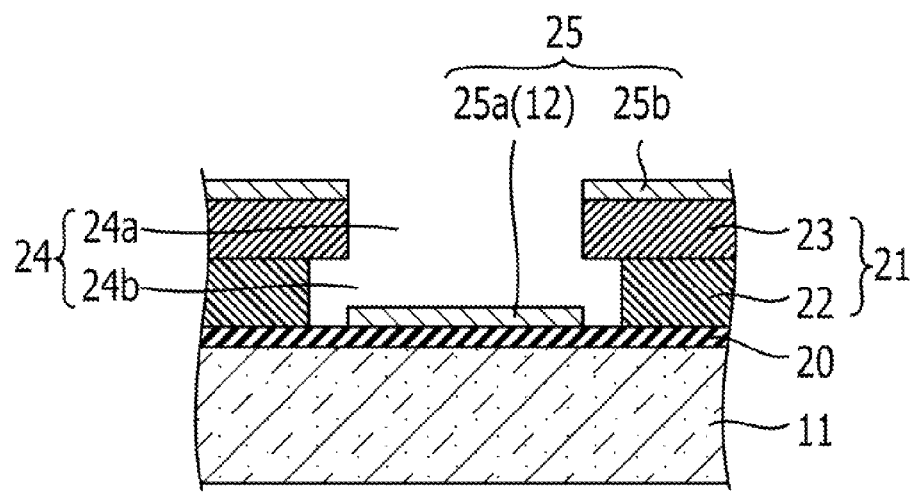

Then, a metallic film 25 is formed as illustrated in FIG. 8C. This metallic film 25 serves as the lower electrode 12 mentioned later, and an example constitution thereof is a laminate of a Ti film (10 nm) and a Au film (300 nm) formed by vacuum deposition. Formed in this way, the metallic film 25 has two portions, a metallic film piece 25a and a metallic film piece 25b. The former is formed in the cavity 24 to spread over the SiN film 20, whereas the latter is formed over the bi-layer pattern 21.

Figure 8D:
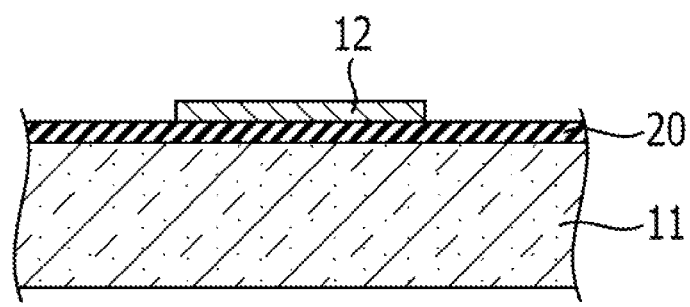

Then, the lower electrode 12 is formed as illustrated in FIG. 8D, by lift-off with hot organic solvent or some other technique. When the lift-off technique is used, the bi-layer pattern 21, more specifically, the alkali-soluble resin layer 22 and the photoresist 23 constituting it, is dissolved by contact with hot organic solvent and washed away together with the metallic film piece 25b formed thereover. As a result, the remaining piece of the metallic film 25, namely, the metallic film piece 25a, is left to provide the lower electrode 12.

Figure 8E:
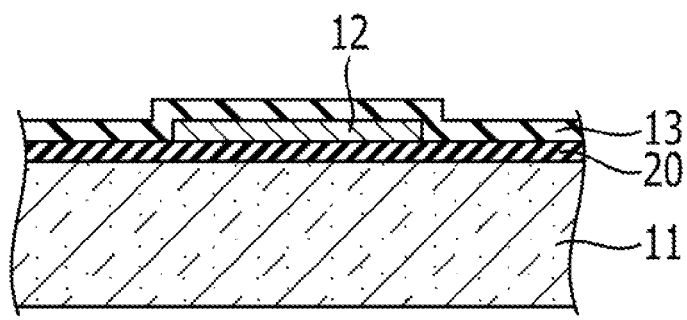

Then, a first insulating film 13, a SiN film, is formed as illustrated in FIG. 8E, by plasma CVD or some other technique. When plasma CVD is used, example film formation conditions are as follows: $SiH_4$ flow rate: about 7 sccm; $N_2$ flow rate: about 150 sccm; plasma excitation frequency: about 380 kHz; electrical power applied: about 100 W; temperature: about 250° C.; pressure: about 500 mTorr; target thickness: about 10 nm. Formed under the high-precursor-energy conditions, the resultant first insulating film 13 includes some portion of the metallic materials of the lower electrode 12 as metallic contaminants. For the thus obtained SiN film, the density is on the order of 2.8 g/cm$^3$ to 3.0 g/cm$^3$, and the degree of hydrogen termination is approximately $5 \times 10^{21}$ groups/cm$^3$.

Figure 8F:
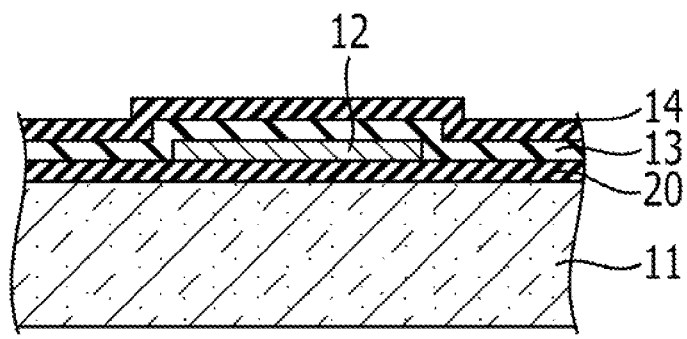

Then, a second insulating film 14, a SiN film, is formed as illustrated in FIG. 8F, by plasma CVD or some other technique. When plasma CVD is used, example film formation conditions are as follows: $SiH_4$ flow rate: about 3 sccm; $N_2$ flow rate: about 150 sccm; plasma excitation frequency: about 13.56 MHz; electrical power applied: about 50 W; temperature: about 250° C.; pressure: about 1000 mTorr. Formed under the low-precursor-energy conditions, the resultant second insulating film 14 is usually free from the metallic materials of the lower electrode 12. For the thus obtained SiN film, the density is on the order of 2.4 g/cm$^3$ to 2.8 g/cm$^3$, and the degree of hydrogen termination is approximately $1 \times 10^{22}$ groups/cm$^3$. In qualitative terms, the second insulating film 14 has a lower density and a higher degree of hydrogen termination than the first insulating film 13.

Figure 8G:
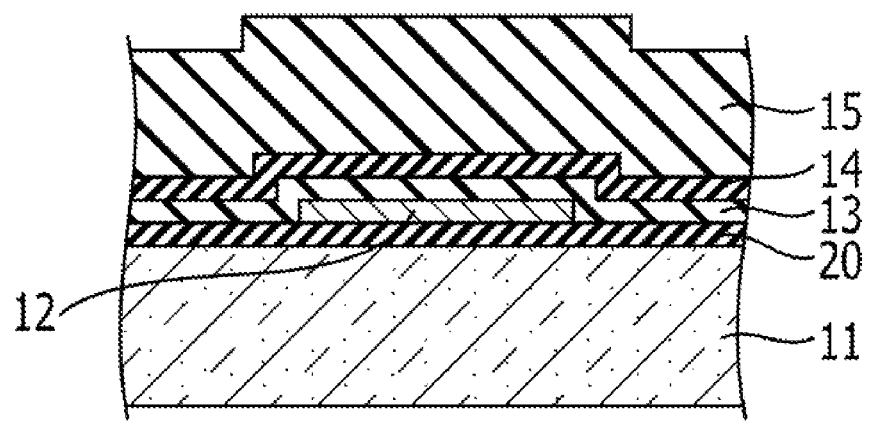

Then, a third insulating film 15, a SiN film, is formed as illustrated in FIG. 8G, by plasma CVD or some other technique. When plasma CVD is used, example film formation conditions are as follows: SiH$_4$ flow rate: about 7 sccm; N$_2$ flow rate: about 150 sccm; plasma excitation frequency: about 380 kHz; electrical power applied: about 100 W; temperature: about 250° C.; pressure: about 500 mTorr; target thickness: about 200 nm. Formed under the high-precursor-energy conditions, the resultant third insulating film 15 is highly resistant to dielectric breakdown. For the thus obtained SiN film, the density is on the order of 2.8 g/cm$^3$ to 3.0 g/cm$^3$, and the degree of hydrogen termination is approximately 5×10$^{21}$ groups/cm$^3$. In qualitative terms, the third insulating film 15 has a higher density and a lower degree of hydrogen termination than the second insulating film 14.

Figure 8H:
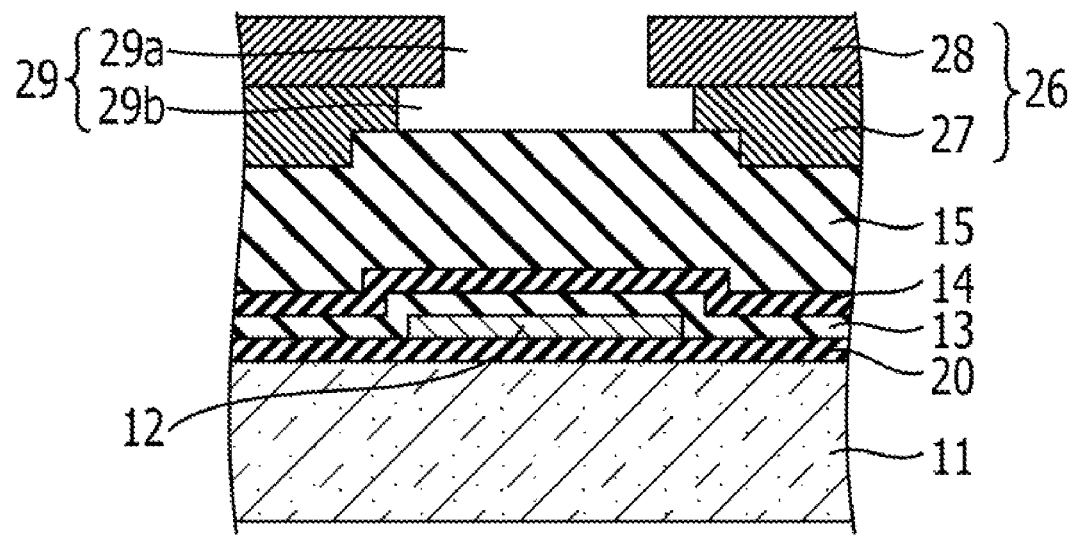
Figure 8I:
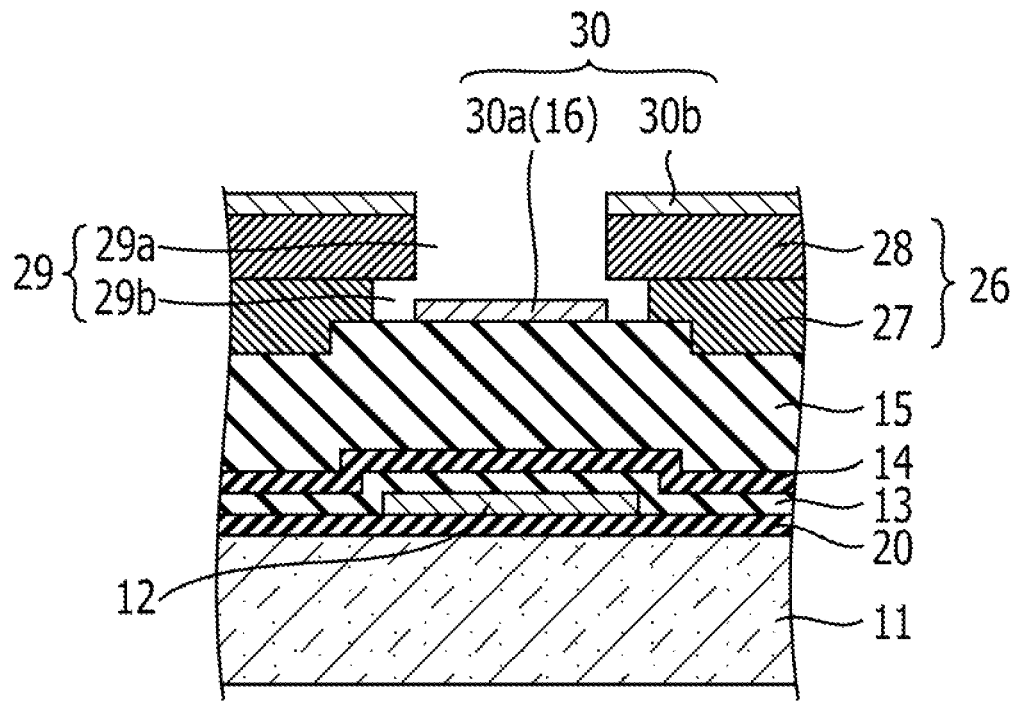

Then, another bi-layer pattern 26, the pattern used to form the upper electrode 16 mentioned later, is formed as illustrated in FIG. 8H. This bi-layer pattern 26 is formed in substantially the same way and from substantially the same materials as the bi-layer pattern 21, and thus an example constitution thereof is a combination of an alkali-soluble resin layer 27 and a photoresist 28. The bi-layer pattern 26 is irradiated with ultraviolet light and then developed; as a result, openings 29a and 29b, which are collectively referred to as a cavity 29, are formed. In the cavity 29 formed in this way, the opening 29b is greater than the opening 29a, as in the cavity 29.

Figure 8J:
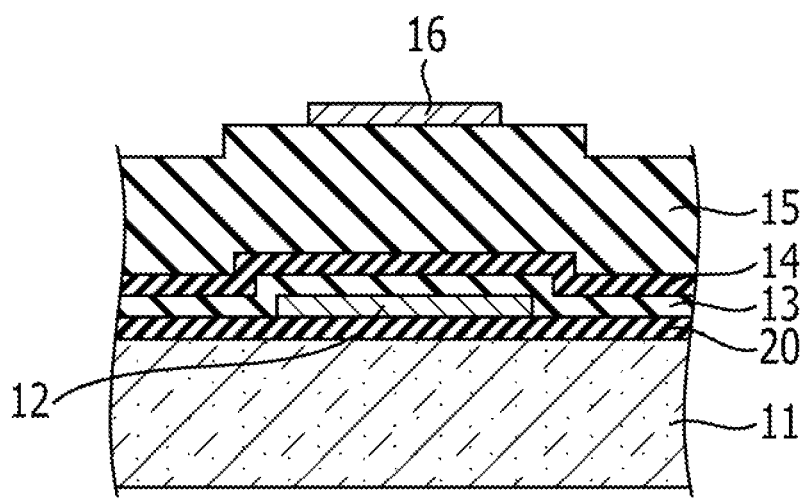

Then, a metallic film 30 is formed as illustrated in FIG. 8J. This metallic film 30 serves as the upper electrode 16 mentioned later, and an exemplary constitution thereof is a laminate of a Ti film (10 nm) and a Au film (300 nm) formed by vacuum deposition. Formed in this way, the metallic film 30 has two portions, a metallic film piece 30a and a metallic film piece 30b. The former is formed in the cavity 29 to spread over the third insulating film 15, whereas the latter is formed over the bi-layer pattern 26.

Then, the upper electrode 16 is formed as illustrated in FIG. 8J, by lift-off with hot organic solvent or some other technique. When the lift-off technique is used, the bi-layer pattern 26, more specifically, the alkali-soluble resin layer 27 and the photoresist 28 constituting it, is dissolved by contact with hot organic solvent and washed away together with the metallic film piece 30b formed thereover. As a result, the remaining piece of the metallic film 30, namely, the metallic film piece 30a, is left to provide the upper electrode 16.

In this way, an MIM capacitor according to the first embodiment is completed.

Figure 9:
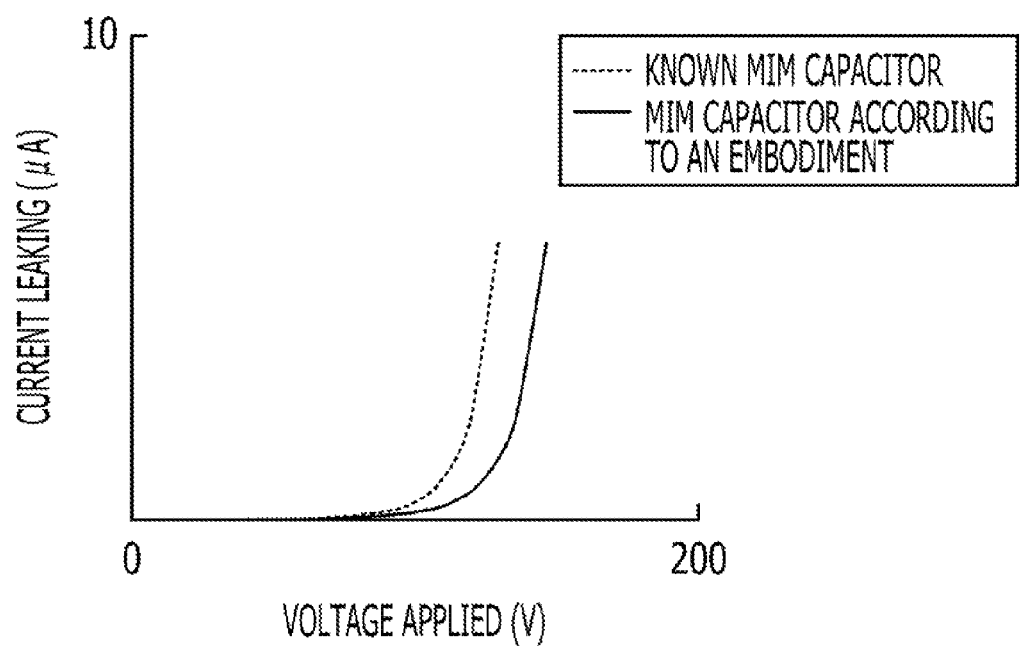
FIG. 9 illustrates a relationship between the voltage applied to an MIM capacitor and the current leaking from the capacitor.

FIG. 9 illustrates a relationship between the voltage applied to an MIM capacitor fabricated in the way specified above and the current leaking from the capacitor. As can be seen from this chart, the MIM capacitor according to the first embodiment could withstand a higher voltage level than a known MIM capacitor like the one illustrated in FIG. 1. The increase in the maximum withstand voltage was approximately 20 V.

The following describes a method for manufacturing an MIM capacitor according to the second embodiment with reference to FIGS. 10A to 10J.

First, a semiconductor substrate 51 is coated with a basal SiN film 60 as illustrated in FIG. 10A, by plasma CVD or some other technique. The semiconductor substrate 51 is made of GaN or some other kind of compound.

Then, a bi-layer pattern 61, the pattern used to form the lower electrode 52 mentioned later, is formed as illustrated in FIG. 10B. An example constitution of this bi-layer pattern 61 is a combination of an alkali-soluble resin layer 62 and a photoresist 63. An example formation method of the alkali-soluble resin layer 62 is as follows: The SiN film 60 is covered with PMGI, an alkali-soluble resin, by spin coating until the thickness of the coating is about 500 nm, and then the coating is heated at about 180° C. Also, an example formation method of the photoresist 63 is as follows: The alkali-soluble resin layer 62 is coated with PFI-32A, an ultraviolet-curable resist, by spin coating until the thickness of the coating is about 1000 nm, and then the coating is heated at about 110° C. Subsequently, the bi-layer pattern 61 is irradiated with ultraviolet light and then developed; as a result, openings 64a and 64b, which are collectively referred to as a cavity 64, are formed. An example of developers that can be used here is MND-W, a product from Tokyo Ohka Kogyo Co., Ltd., with which selected areas of the photoresist 63 and the whole alkali-soluble resin layer 62 can be dissolved. In the development process, the developer dissolves selected areas of the photoresist 63, leaving the opening 64a, and then flows through this opening 64a onto the alkali-soluble resin layer 62 and dissolves it slowly and isotropically, leaving the opening 64b. Thus, the opening 64b is greater than the opening 64a.

Then, a metallic film 65 is formed as illustrated in FIG. 10C. This metallic film 65 serves as the lower electrode 52 mentioned later, and an example constitution thereof is a laminate of a Ti film (10 nm) and a Au film (300 nm) formed by vacuum deposition. Formed in this way, the metallic film 65 has two portions, a metallic film piece 65a and a metallic film piece 65b. The former is formed in the cavity 64 to spread over the SiN film 60, whereas the latter is formed over the bi-layer pattern 61.

Figure 10D:
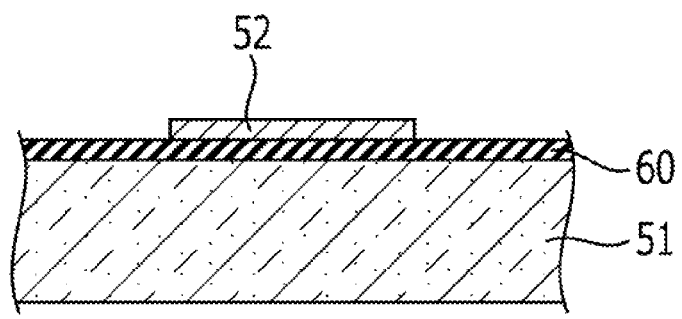

Then, the lower electrode 52 is formed as illustrated in FIG. 10D, by lift-off with hot organic solvent or some other technique. When the lift-off technique is used, the bi-layer pattern 61, more specifically, the alkali-soluble resin layer 62 and the photoresist 63 constituting it, is dissolved by contact with hot organic solvent and washed away together with the metallic film piece 65b formed thereover. As a result, the remaining piece of the metallic film 65, namely, the metallic film piece 65a, is left to provide the lower electrode 52.

Figure 10E:
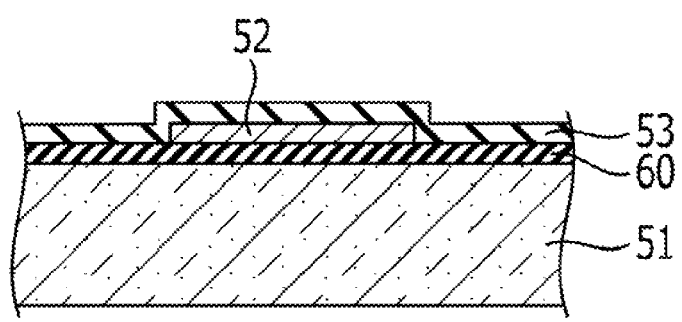

Then, a first insulating film 53, a SiN film, is formed as illustrated in FIG. 10E, by plasma CVD or some other technique. When plasma CVD is used, example film formation conditions are as follows: SiH$_4$ flow rate: about 7 sccm; N$_2$ flow rate: about 150 sccm; plasma excitation frequency: about 380 kHz; electrical power applied: about 100 W; temperature: about 250° C.; pressure: about 500 mTorr; target thickness: about 10 nm. Formed under the high-precursor-energy conditions, the resultant first insulating film 53 includes some portion of the metallic materials of the lower electrode 52 as metallic contaminants.

Figure 10F:
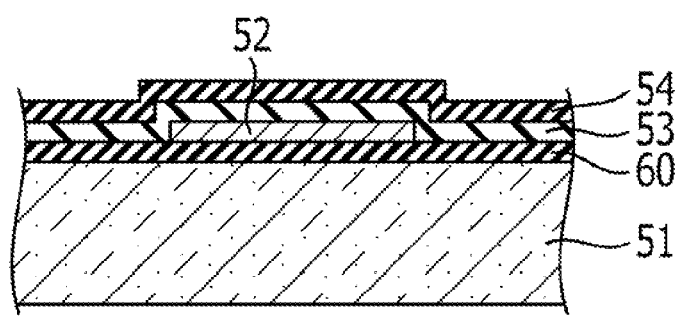

Then, a second insulating film 54, a SiN film, is formed as illustrated in FIG. 10F, by plasma CVD or some other technique. When plasma CVD is used, example film formation conditions are as follows: SiH$_4$ flow rate: about 3 sccm; N$_2$ flow rate: about 150 sccm; plasma excitation frequency: about 13.56 MHz; electrical power applied: about 50 W; temperature: about 250° C.; pressure: about 1000 mTorr. Formed under the low-precursor-energy conditions, the resultant second insulating film 54 is usually free from the metallic materials of the lower electrode 52.

Figure 10G:
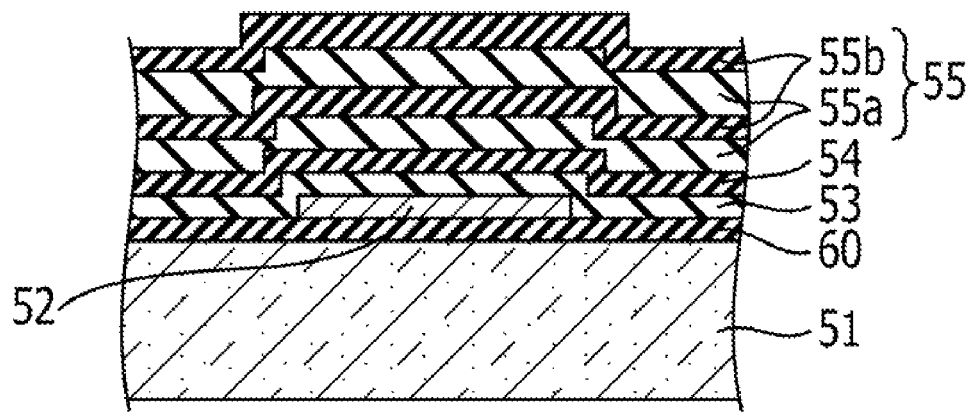

Then, a third insulating film 55, a SiN film, is formed as illustrated in FIG. 10G, by plasma CVD or some other technique. More specifically, the third insulating film 55 is a laminate obtained by alternately layering two kinds of SiN films: One is a first insulating layer 55a, which is formed under the high-precursor-energy conditions, and the other is a second insulating layer 55b, which is formed under the low-precursor-energy conditions. An example method for forming the third insulating film 55 is as follows: the second insulating film 54 is coated with a sheet of the first insulating layer 55a, a sheet of the second insulating layer 55b, another sheet of the first insulating layer 55a, and then another sheet of the second insulating layer 55b, with the target thickness set at about 50 nm for all the coating sheets. For the first insulating layer 55a, example film formation conditions are as follows: SiH$_4$ flow rate: about 7 sccm; N$_2$ flow rate: about 150 sccm; plasma excitation frequency: about 380 kHz; electrical power applied: about 100 W; temperature: about 250° C.; pressure: about 500 mTorr (high-precursor-energy conditions). For the second insulating layer 55b, example film formation conditions are as follows: SiH$_4$ flow rate: about 3 sccm; N$_2$ flow rate: about 150 sccm; plasma excitation frequency: about 13.56 MHz; electrical power applied: about 50 W; temperature: about 250° C.; pressure: about 1000 mBar (low-precursor-energy conditions).

Figure 10H:
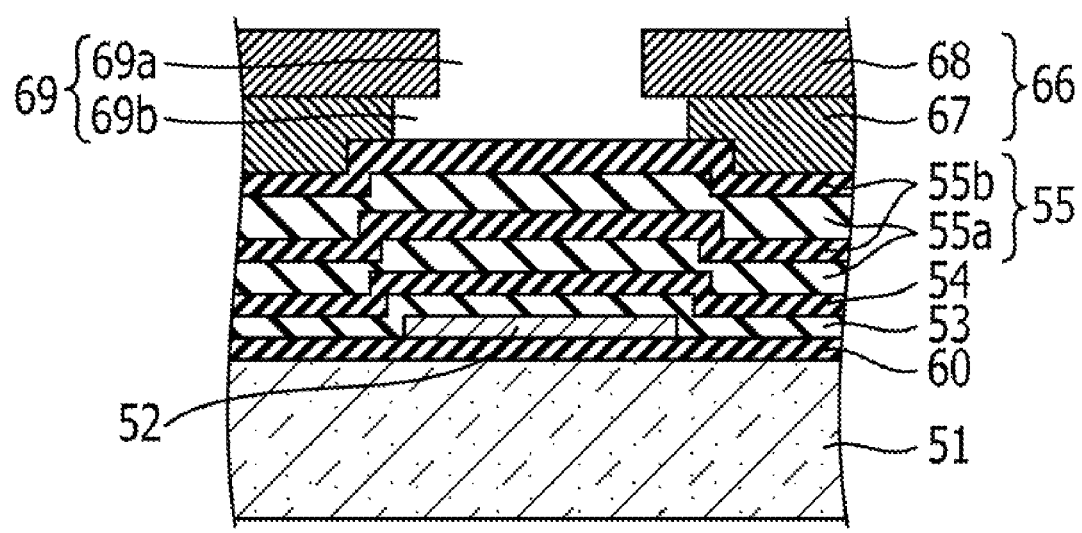
Figure 10I:
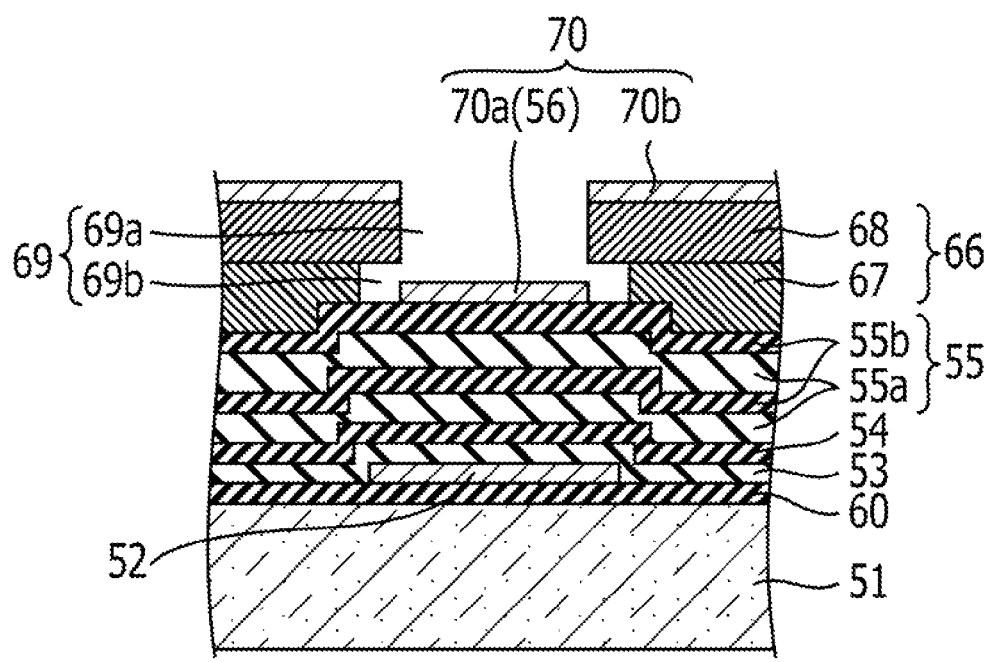

Then, another bi-layer pattern 66, the pattern used to form the upper electrode 56 mentioned later, is formed as illustrated in FIG. 10H. This bi-layer pattern 66 is formed in substantially the same way and from substantially the same materials as the bi-layer pattern 61, and thus an example constitution thereof is a combination of an alkali-soluble resin layer 67 and a photoresist 68. The bi-layer pattern 66 is irradiated with ultraviolet light and then developed; as a result, openings 69a and 69b, which are collectively referred to as a cavity 69, are formed. In the cavity 69 formed in this way, the opening 69b is greater than the opening 69a, as in the cavity 69.

Figure 10J:
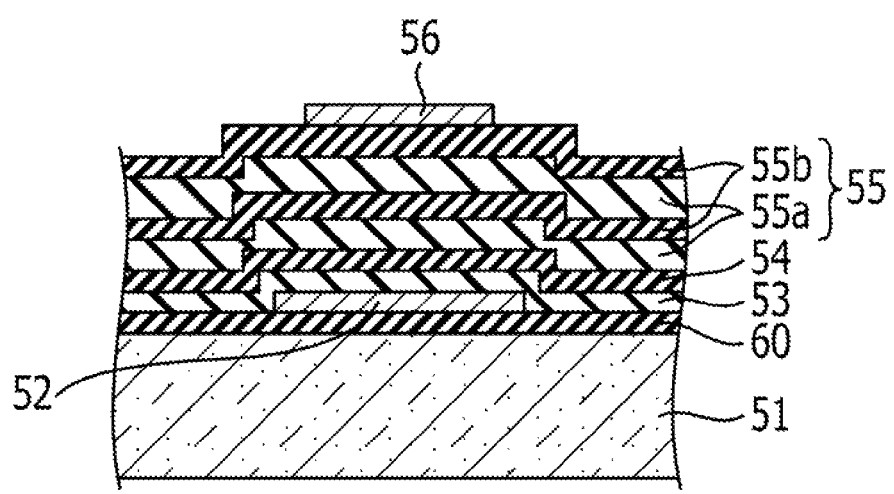

Then, a metallic film 70 is formed as illustrated in FIG. 10J. This metallic film 70 serves as the upper electrode 66 mentioned later, and an example constitution thereof is a laminate of a Ti film (10 nm) and a Au film (300 nm) formed by vacuum deposition. Formed in this way, the metallic film 70 has two portions, a metallic film piece 70a and a metallic film piece 70b. The former is formed in the cavity 69 to spread over the third insulating film 55, whereas the latter is formed over the bi-layer pattern 66.

Then, the upper electrode 66 is formed as illustrated in FIG. 10J, by lift-off with hot organic solvent or some other technique. When the lift-off technique is used, the bi-layer pattern 66, more specifically, the alkali-soluble resin layer 67 and the photoresist 68 constituting it, is dissolved by contact with hot organic solvent and washed away together with the metallic film piece 70b formed thereover. As a result, the remaining piece of the metallic film 70, namely, the metallic film piece 70a, is left to provide the upper electrode 56.

In this way, an MIM capacitor according to the second embodiment is completed.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments in accordance with aspects of the present inventions have been described in detail, it should be understood that various changes, substitutions, and alterations could be made hereto without departing from the spirit and scope of the invention.

What is claimed is:

1. A capacitor comprising:
a lower electrode formed over a semiconductor substrate;
a first insulating film formed over the lower electrode;
a second insulating film formed over the first insulating film;
a third insulating film formed over the second insulating film; and
an upper electrode formed over the third insulating film,
the density of the first insulating film being greater than that of the second insulating film, and the density of the third insulating film being greater than that of the second insulating film.

2. A capacitor comprising:
a lower electrode formed over a semiconductor substrate;
a first insulating film formed over the lower electrode;
a second insulating film formed over the first insulating film;
a third insulating film formed over the second insulating film; and
an upper electrode formed over the third insulating film,
the degree of hydrogen termination in the first insulating film being less than that in the second insulating film, and the degree of hydrogen termination in the third insulating film being less than that in the second insulating film.

3. The capacitor according to claim 1, wherein
the concentration of elements constituting the lower electrode in the first insulating film being greater than that in the second insulating film.

4. The capacitor according to claim 2, wherein
the concentration of elements constituting the lower electrode in the first insulating film being greater than that in the second insulating film.

5. The capacitor according to claim 1, wherein
the third insulating film is a laminate of a first insulating layer and a second insulating layer alternately layered, and the density of the first insulating layer being greater than that of the second insulating layer.

6. The capacitor according to claim 2, wherein
the third insulating film is a laminate of a first insulating layer and a second insulating layer alternately layered, and the density of the first insulating layer being greater than that of the second insulating layer.

7. The capacitor according to claim 1, wherein
the third insulating film is a laminate of a first insulating layer and a second insulating layer alternately layered, and the degree of hydrogen termination in the first insulating layer being less than that in the second insulating layer.

8. The capacitor according to claim 2, wherein
the third insulating film is a laminate of a first insulating layer and a second insulating layer alternately layered, and the degree of hydrogen termination in the first insulating layer being less than that in the second insulating layer.

9. The capacitor according to claim 1, wherein
the first insulating film, the second insulating film, and the third insulating film are made of a single kind of insulating material.

10. The capacitor according to claim 2, wherein
the first insulating film, the second insulating film, and the third insulating film are made of a single kind of insulating material.

11. The capacitor according to claim 9, wherein
the single kind of insulating material is silicon nitride.

12. The capacitor according to claim 10, wherein
the single kind of insulating material is silicon nitride.

13. The capacitor according to claim 1, wherein
the semiconductor substrate is made of a compound semiconductor.

14. The capacitor according to claim 2, wherein
the semiconductor substrate is made of a compound semiconductor.

15. The capacitor according to claim 1, wherein
the lower electrode is made of a metallic material.

16. The capacitor according to claim 2, wherein the lower electrode is made of a metallic material.

17. The capacitor according to claim 15, wherein the metallic material includes gold.

18. The capacitor according to claim 15, wherein the metallic material includes gold.

19. A semiconductor device comprising:

a lower electrode formed over a semiconductor substrate;

a first insulating film formed over the lower electrode;

a second insulating film formed over the first insulating film;

a third insulating film formed over the second insulating film; and an upper electrode formed over the third insulating film, the density of the first insulating film being greater than that of the second insulating film, and the density of the third insulating film being greater than that of the second insulating film.

20. A semiconductor device comprising:

a lower electrode formed over a semiconductor substrate;

a first insulating film formed over the lower electrode;

a second insulating film formed over the first insulating film;

a third insulating film formed over the second insulating film; and an upper electrode formed over the third insulating film, the degree of hydrogen termination in the first insulating film being less than that in the second insulating film, and the degree of hydrogen termination in the third insulating film being less than that in the second insulating film.

\* \* \* \* \*